(12) United States Patent
Ganta et al.

(10) Patent No.: US 9,755,332 B1
(45) Date of Patent: Sep. 5, 2017

(54) TERMINAL BLOCKS

(71) Applicant: Hewlett Packard Enterprise Development LP, Houston, TX (US)

(72) Inventors: Sunil Ganta, Houston, TX (US); Andrew Cifala, Ft. Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/189,516

(22) Filed: Jun. 22, 2016

(51) Int. Cl.
 *H01R 12/51* (2011.01)
 *H01R 9/26* (2006.01)
 *H01R 9/22* (2006.01)

(52) U.S. Cl.
 CPC .......... *H01R 12/515* (2013.01); *H01R 9/223* (2013.01); *H01R 9/2675* (2013.01)

(58) Field of Classification Search
 CPC .. H01R 25/145; H01R 12/716; H01R 12/724; H01R 13/187; H01R 13/2421; H01R 13/6683; H01R 13/7137; H01R 13/73; H01R 2103/00; H01R 2107/00; H01R 2201/18; H01R 24/68; H01R 24/76; H01R 25/142
 See application file for complete search history.

(56) References Cited

U.S. PATENT DOCUMENTS

| | | | |
|---|---|---|---|
| 3,952,175 A | 4/1976 | Golbeck et al. | |
| 4,180,305 A * | 12/1979 | Ustin | H01R 9/2408 439/717 |
| 5,378,174 A * | 1/1995 | Brownlie | H01R 13/502 174/652 |
| 5,735,711 A | 4/1998 | Fremgen | |
| 6,359,770 B1 * | 3/2002 | Kolody | H04Q 1/03 361/626 |
| 6,399,910 B1 | 6/2002 | Crawford et al. | |
| 6,404,652 B1 * | 6/2002 | Takebayashi | H01R 9/2408 361/824 |

(Continued)

FOREIGN PATENT DOCUMENTS

CN 204732551 U 10/2015

OTHER PUBLICATIONS

"Wholesale Connection and Disconnection Krone Block 10 Pair Krone Module Terminal Block Hot Price," 2016, pp. 1-7, Alibaba.com.

*Primary Examiner* — Truc Nguyen
(74) *Attorney, Agent, or Firm* — Hewlett Packard Enterprise Patent Department (57) ABSTRACT

An example terminal block may include a frame that is to attach to a power supply casing. The frame may be formed from an electrical insulator, and may include a base, exterior walls connected to the base, and a number of interior walls that separate an interior region of the frame into multiple compartments. The example terminal block may include a cover that may be formed from an electrical insulator and may be connected to the frame such that the cover may transition between an open position and a closed position. Each of the compartments may electrically isolate bus bars from one another, where the bus bars extend from within the power supply casing into the frame. The base may include a nut holder in each of the compartments, each of the nut holders having a cavity formed therein that is shaped so as to hold a nut captive.

18 Claims, 6 Drawing Sheets

(56) References Cited

U.S. PATENT DOCUMENTS

| | | | | |
|---|---|---|---|---|
| 6,497,592 B1* | 12/2002 | Beadle | ................. | H01R 9/2425 |
| | | | | 439/718 |
| 7,559,810 B1* | 7/2009 | Wu | ......................... | H01R 4/34 |
| | | | | 439/709 |
| 7,918,692 B1* | 4/2011 | Hertzler | ............... | H01R 9/2408 |
| | | | | 439/712 |
| 8,422,222 B2* | 4/2013 | Noda | ................... | H05K 7/1432 |
| | | | | 361/689 |
| 2004/0043647 A1* | 3/2004 | Takeuchi | ............. | H01R 13/506 |
| | | | | 439/76.2 |
| 2005/0118867 A1 | 6/2005 | Mumper et al. | | |
| 2008/0261459 A1* | 10/2008 | Choi | .................... | H01R 9/2466 |
| | | | | 439/709 |
| 2013/0280965 A1* | 10/2013 | Kojyo | ...................... | H01R 9/18 |
| | | | | 439/722 |
| 2014/0364016 A1* | 12/2014 | Ozawa | ................ | H01R 13/521 |
| | | | | 439/737 |

\* cited by examiner

TERMINAL BLOCKS

BACKGROUND

Power supplies are devices that supply electrical power in a particular format to some other electronic device. Power supplies may perform additional functions related to supplying the electrical power, such as: converting electrical power from a format that is unusable by the corresponding electronic device into a format that is useable by the electronic device, providing redundant back up power to the electronic device, providing circuit breaking, surge protecting, and/or other protective functions, and so on.

Power supplies may have terminals to which input electrical power may be connected. For example, a cable may be connected to the terminals at one end and to an electrical power source at the other end, and the input electronic power may be transmitted over the cables. Such terminals may be housed within a terminal block.

DETAILED DESCRIPTION

Example Terminal Blocks and Power Supplies—Overview

The present disclosure describes various examples of terminal blocks and power supplies that have such terminal blocks. In certain of these examples, the power supply may be manufactured and/or sold with the terminal block already installed therein. In certain others of these examples, the power supply and the terminal block may be manufactured and/or sold separately, and the terminal block may be installed in the power supply at a later time (for example, by a user). In the following description, the example terminal blocks will be described in a state in which they are installed in an example power supply for convenience of description, but this should not be interpreted to imply that the example terminal blocks being described are necessarily manufactured and/or sold already installed in the power supplies. Thus, descriptions herein that explain how a given feature of an example terminal block interacts with a given feature of an example power supply in which it is installed should be understood to imply, in the context of a terminal block that is provided separately from a power supply, the capability of the given feature of the terminal block to interact with the given feature of the power supply in the manner described, rather than requiring that the feature of the terminal block has actually so interacted with the feature of the power supply.

The example terminal blocks may be to house terminals that are for connecting an input electrical power to the power supply. In certain examples, the terminals of the terminal block may be formed from bus bars (for example, bus bars 240) that are electrically connected to internal circuitry of the power supply. In certain examples, electrical connectors (such as wiring, cables, cords, etc.) may be connected between an external power source and the bus bars, thereby forming an electrically conductive path between the external power source and the internal circuitry of the power supply. The electrical connectors (e.g., cables) may be physically and electrically connected to the bus bar via lugs (for example, lugs 400), and the lugs may be attached to the connectors at one end and may be secured to the bus bars via fasteners at the other end.

In examples in which a power supply is provided with a terminal block already installed therein, a user may connect the power supply to the external power source by installing lugs in the terminal block (if they are not already so installed) and connecting the electrical connectors to the lugs (if they are not already so connected).

In examples in which a terminal block is provided separately from a power supply, a user may install the terminal block in the power supply before connecting the power supply the external power source. For example, the user may install the terminal block in the power supply by connecting bus bars to internal circuitry of the power supply (such as the example printed circuit board 300) and connecting a frame of the terminal block (such as the example frame 210) to a casing of the power supply (such as the example casing 100). Upon installing the terminal block in the power supply, the user may connect the power supply to the external power source by installing lugs in the terminal block (if they are not already so installed) and connecting the electrical connectors to the lugs (if they are not already so connected).

The example terminal blocks may include a frame (such as the example frame 200) and a cover (such as the example cover 220) that are not electrically conductive and that surround the bus bars and lugs (once they are installed) on all sides except for at openings through which the electrical connectors may be inserted and at openings through which the bus bars extend into the power supply casing. This may ensure that live terminals are electrically isolated from the user once the terminal block has been installed, thus increasing the safety of the power supply.

The cover may be capable of being opened so as to expose the interior of the terminal block, which may provide a user easy access to the terminals so that the user may inspect them, repair them, perform maintenance on them, replace them, etc. For example, the cover may be rotably connected at one end thereof to the frame such that opening the cover comprises rotating the cover. As another example, the cover may be slidably engaged by the frame such that opening the cover comprises sliding the cover horizontally relative to the frame. As another example, the cover may be removeably connected to the frame, such that opening the cover comprises removing the cover from the frame. The cover may also include a latch that helps prevent the cover from opening unless the latch is manually released by the user, which may help ensure that the cover does not unintentionally open and thereby expose the live terminals. In examples in which the cover is rotably connected to the frame, the cover may include a detent that holds the cover in an opened position to prevent unintentional closing of the cover while a user is attempting to access the interior of the terminal block.

The example terminal blocks may include integral means to fasten the lugs to the bus bars. The means to fasten the lugs to the bus bars may be housed in the frame of the terminal block. For example, the terminal block may include nuts (such as the example the nuts 250) that are held captive by portions of the frame (such as the example nut holders 213) such that a user may fasten lugs to the bus bars by inserting a screw through the lugs and the bus bars into the captive nuts and then tightening the screw. This simplifies the installation of the lugs in the terminal block as well as simplifying the removal of already installed lugs, as the user does not have to manually constrain the nuts while tightening or loosening the screws (since the nuts are automatically held captive by the terminal block). The terminal block may also house the bus bars and hold the nuts such that the nuts are automatically located beneath corresponding holes in the bus bars. This simplifies the installation of the lugs in the terminal block, as the user does not have to manually locate the nuts in the appropriate positions to receive the screws (since they are automatically held by the terminal block in the appropriate locations). As used herein and in the appended claims, references to an element holding the nuts "captive" or "captively" mean that the rotation of the nut around a central axis thereof is constrained by the element. This constraint of rotation does not necessarily mean that the nut is kept from any rotating at all, but rather that the rotation of the nut is kept to within some finite range.

In addition to electrically isolating the terminals from a user, the terminal block may also electrically isolate the terminals from one another (at least within the terminal block). For example, the frame may include interior walls (such as the example interior walls 214) that electrically isolate the terminals from one another. For example, the interior walls may electrically isolate the terminals from one another by, among other things, preventing the terminals from coming into direct contact with one another. As another example, the interior walls may also electrically isolate the terminals from one another by, among other things, decreasing the likelihood of electrical breakdown (arcing) between the terminals, as the presence of the interior walls directly between the terminals may increase the breakdown voltage between the terminals (i.e., the minimum voltage that would result in electrical breakdown between the terminals). In certain examples, electrically isolating the terminals from one another may include electrically isolating the bus bars from one another at least within the terminal block. In certain examples, electrically isolating the terminals from one another may include electrically isolating the lugs from one another when the lugs are installed in the terminal block.

As used herein and in the appended claims, the interior walls electrically "isolate" the bus bars or lugs from one another if each pair of adjacent bus bars or lugs has an interior wall disposed therebetween such that, for every point that is on one member of the pair of adjacent bus bars or lugs and that is within the terminal block, a shortest possible line between that respective point and the other member of the pair of adjacent bus bars or lugs passes through the interior wall. In other words, the interior walls electrically isolate the bus bars/lugs from one another in the sense that they completely cover one bus bar/lug from the perspective of the adjacent bus bar/lug, at least within the terminal block.

Thus, the aforementioned electrical isolation of the terminals from one another does not require that the bus bars or lugs each be completely sealed off from the other terminals on all sides, or anything of the sort. For example, in the example terminal block 200 there are holes 216 in the front wall 211a that allow electrical connectors to connect to the lugs 400, and thus the lugs 400 are not completely sealed off from one another. However, this does not prevent the interior wall 214 from electrically isolating the lugs 400 from one another, since, for example, the holes 216 do not occur anywhere directly between the lugs 400. In addition, the definition noted above of what it means to electrical "isolate" the bus bars or lugs from one another refers to portions of the bus bars or lugs that are within the frame of the terminal block, and does not specify anything about any portions of the bus bars or lugs that might extend outside of the frame of the block. Thus, for example, the fact that the example interior wall 214 shown in FIGS. 1-8 is not shown as being disposed between the portions of the bus bars 240 that extend outside of the terminal block 200 into the casing 100 does not mean that the interior wall 214 fails to electrically isolate the bus bars 240 from one another.

The terminal block may house any number of bus bars greater than or equal to two. Each bus bar may be housed within its own compartment (such as the example compartments 215), which may be defined by the frame and interior walls of the terminal block. Each compartment may also be configured to accommodate a lug that is connected to the bus bar that is housed in the compartment. In certain examples, the compartments are such that, when a lug is connected to its corresponding bus bar, the front end of the lug does not extend outside of the compartment (i.e., does not extend outside of the terminal block), which may help facilitate isolation of the live terminals from the user. Each compartment may have its own instances of the integral means for fastening the lugs to the corresponding bus bar that were described above. In particular, each compartment may have a nut holder and a nut that is held captive in the nut holder.

The terminal block may also include a stabilizer (such as the example stabilizer 218) that extends from the frame into the power supply casing and contacts an element housed therein to help stabilize the terminal block and/or to help stabilize the element. For example, the stabilizer may contact a printed circuit board (PCB) of the power supply, such that upward and/or downward motion of a distal end of the terminal block is resisted by the stabilizer coming into contact with a side of the PCB, and/or upward/downward motion of the PCB is resisted by the PCB coming into contact with the stabilizer. The stabilization provided by the stabilizer may be considered as being predominately a result of the PCB stabilizing the terminal block, predominately a result of the terminal block stabilizing the PCB, and/or as a result of the terminal block and the PCB mutually stabilizing each other (depending on how securely the PCB and the terminal block are anchored to the power supply casing). The stabilizer may contact the PCB on only one side thereof (for example, the top side), or it may contact the PCB on two sides thereof (for example, the top and bottom sides). When the stabilizer contacts one side of the PCB, motion of the distal end of the terminal block and/or motion of the PCB in one direction may be resisted; for example, if the stabilizer contacts a top side of the PCB, then upward motion of the distal end of the terminal block and/or the PCB would be resisted. When the stabilizer contacts two sides of the PCB, motion of the distal end of the terminal block and/or motion of the PCB in two directions may be resisted; for example, if the stabilizer contacts a top side and a bottom side of the PCB, then upward and downward motion of the distal end of the terminal block and/or PCB would be resisted. In certain examples, it may be sufficient to have the stabilizer resist motion in one direction, as motion in a second direction may already be adequately resisted by other mechanisms. In certain examples, the stabilizer extends between the bus bars within the power supply casing, and thus may provide an additional function of electrically isolating the bus bars (or a portion thereof) from one another within the power supply casing. In certain examples, the bus bars may act as a cantilever on the PCB, and the connection of the bus bars to external cables may exert forces on the PCB that would cause it to flex; however, the stabilizer may help to resist such forces from the bus bars and prevent the PCB from flexing. In other examples, the terminal block may be subjected to forces as the power supply is handled by users, and, although the terminal block may already be connected to the power supply casing, the connections may not be sufficient on their own to prevent the terminal block from being moved; however, the stabilizer may help prevent such motion of the terminal block.

The terminal block may be connected to the power supply casing by connectors (such as the example connectors 230) that are removable, such as screws or bolts. This may facilitate easy removal of the terminal block from the power supply, which may be useful, for example, if the terminal block has been damaged and needs to be replaced. In this context, "removable" means that the connectors can be removed without deforming or damaging the connectors, the terminal block, or the casing.

The terminal block may also include a latching mechanism (such as the example lock 219) that may extend into the power supply casing and hook onto a wall of the power supply casing. This, together with the aforementioned connectors, may help to secure the terminal block to the power supply casing. The inclusion of the latching mechanism may allow certain connectors that might otherwise be needed to be omitted. For example, screws that might be included on a bottom side of the terminal block to help connect the terminal block to the power supply casing might be omitted if the latching mechanism is included on the bottom side of the terminal block. This may be helpful, for example, in cases in which a location of such connectors would make it difficult to access the connectors so as to fasten/unfasten them. For example, in the example terminal block 200, if connectors (such as screws) were included on a bottom side of the back wall 211c, it might be difficult to access the connectors to fasten/unfasten them, since the nut holders 213 may get in the way.

In certain examples, the terminal block may be provided with lugs already connected to the bus bars. In other examples, the terminal block may be provided with lugs that are not connected to the bus bars, and the user may connected the lugs to the bus bars. In other examples, the terminal block may be provided without lugs, and a user may provide the lugs separately and connect them to the bus bars. In certain examples, the lugs may already be connected to the external electrical connectors prior to being connected to the bus bars, while in other examples the lugs may be connected to the bus bars first and then subsequently connected to the external electrical connectors. In certain examples, the lugs may include a connector receiving portion that attaches to the electrical connectors and a fastener portion that includes one or more holes through which fasteners can be inserted so as to connect the lug to a bus bar. The lugs may include conductive materials at points of contact between the lug and the electrical connectors and between the lug and the bus bars, such that the lugs are able to form a conductive path between the electrical connector and the bus bars. In certain examples, the lugs may be attached to the electrical connector by inserting the wire/cable into a receiving portion of the lug and then crimping the receiving portion of the lug such that the wire/cable is held in the lug by friction. In certain examples, the lugs may be attached to a bus bar by inserting a fastener (such as a bolt) through a hole in the fastener portion of the lug and through a corresponding hole in the bus bar. In certain examples, the lugs may be connected to the electrical connectors in a semi-permanent manner, meaning that disconnecting them from one another may require removing a connection mechanism (such as a clamp or screw) or exerting a force that would deform or shear portions of the connectors or lugs.

As noted above, the lugs may be connected to the bus bars by removable fasteners that may be easily accessed via the cover, and the fasteners may be easily fastened/unfastened as a result of the integral nut holder holding captive nut, and therefore may be relatively simple for a user to install or uninstall the lugs. This ease of installation is not only helpful upon an initial installation of the lugs, but may also enable a user to readily change which lugs are installed in the terminal block without the user having to disassemble the terminal block or replace the terminal block in its entirety. This may be helpful in situations in which a user desires, for example, to change a gauge of wiring/cable that is connected to the terminal block and hence may need to change the type of lugs that are used in the terminal block.

Various example power supplies and terminal blocks were described above, and various features were described in relation to these examples. One of these example power supplies, namely example power supply 10, as well as one of the example terminal blocks, namely example terminal block 200, will be described in greater detail below with reference to FIGS. 1-8. The example power supply 10 and the example terminal block 200 happen to include specific examples of each of the features that were described above; however, this should not be interpreted to imply that each example power supply or each example terminal block that is described herein necessarily includes all of these features. In particular, it should be understood that this disclosure describes example power supplies and example terminal blocks having any and all possible combinations or permutations of the features described above.

[Detailed Examples of a Power Supply and a Terminal Block]

Figure 1:
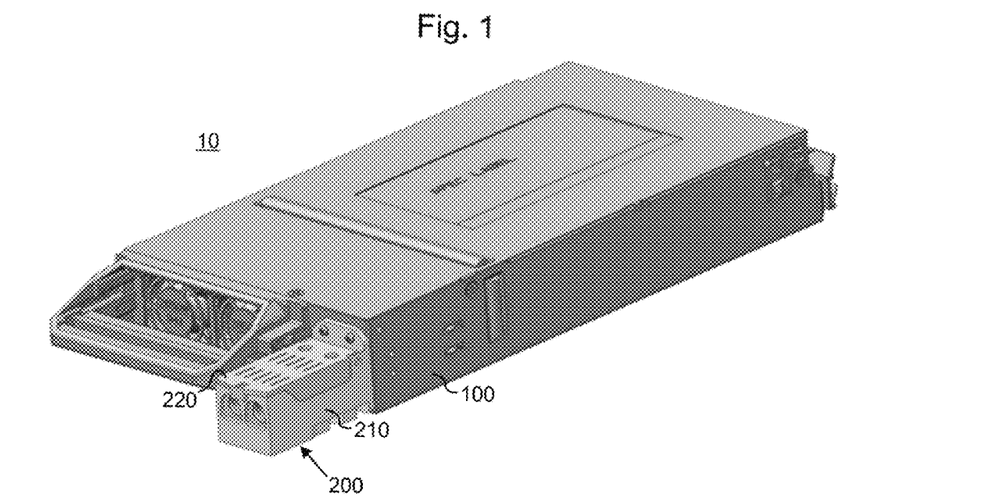
FIG. 1 is a perspective view of an example power supply that has an example terminal block.

FIG. 1 illustrates an example power supply 10. The example power supply 10 may include a power supply casing 100, a terminal block 200, and internal components that are to, among other things, receive the input electrical power and generate the output electrical power of the power supply. The aforementioned internal components may be housed within the power supply casing 100, and may include a printed circuit board (PCB) 300, which has an input terminal for receiving the input electrical power. The input electrical power may be conducted inside of the power supply casing 100 by portions of the terminal block 200, which may have received the input electrical power from external electrical connectors (such as a cable).

Although FIGS. 1-8 illustrate the terminal block 200 in a state in which it is installed in the power supply 10, it should be understood that the terminal block 200 may also be provided separately from the power supply 10.

FIGS. 2-8 illustrate, among other things, additional details of the terminal block 200. The terminal block 200 may include a frame 210 (see FIGS. 2-8), a cover 220 (see FIGS. 2-8), connectors 230 (see FIGS. 2, and 6-8), bus bars 240 (see FIGS. 4, 6, and 7), and nuts 250 (see FIGS. 5 and 6).

In certain examples, the terminal block 200 when manufactured and/or sold may also include lugs 400 and/or fasteners 401 (see FIGS. 3 and 6); in some such examples, the lugs 400 and the fasteners 401 may be provided in an installed state, while in other such examples the lugs 400 and fasteners 401 may be provided in a non-installed state. In other examples, the lugs 400 and/or the fasteners 401 may be provided separately from the terminal block 200; for example, a user might provide the lugs 400 and/or the fasteners 401 and might install them in the terminal block 200.

Figure 6:
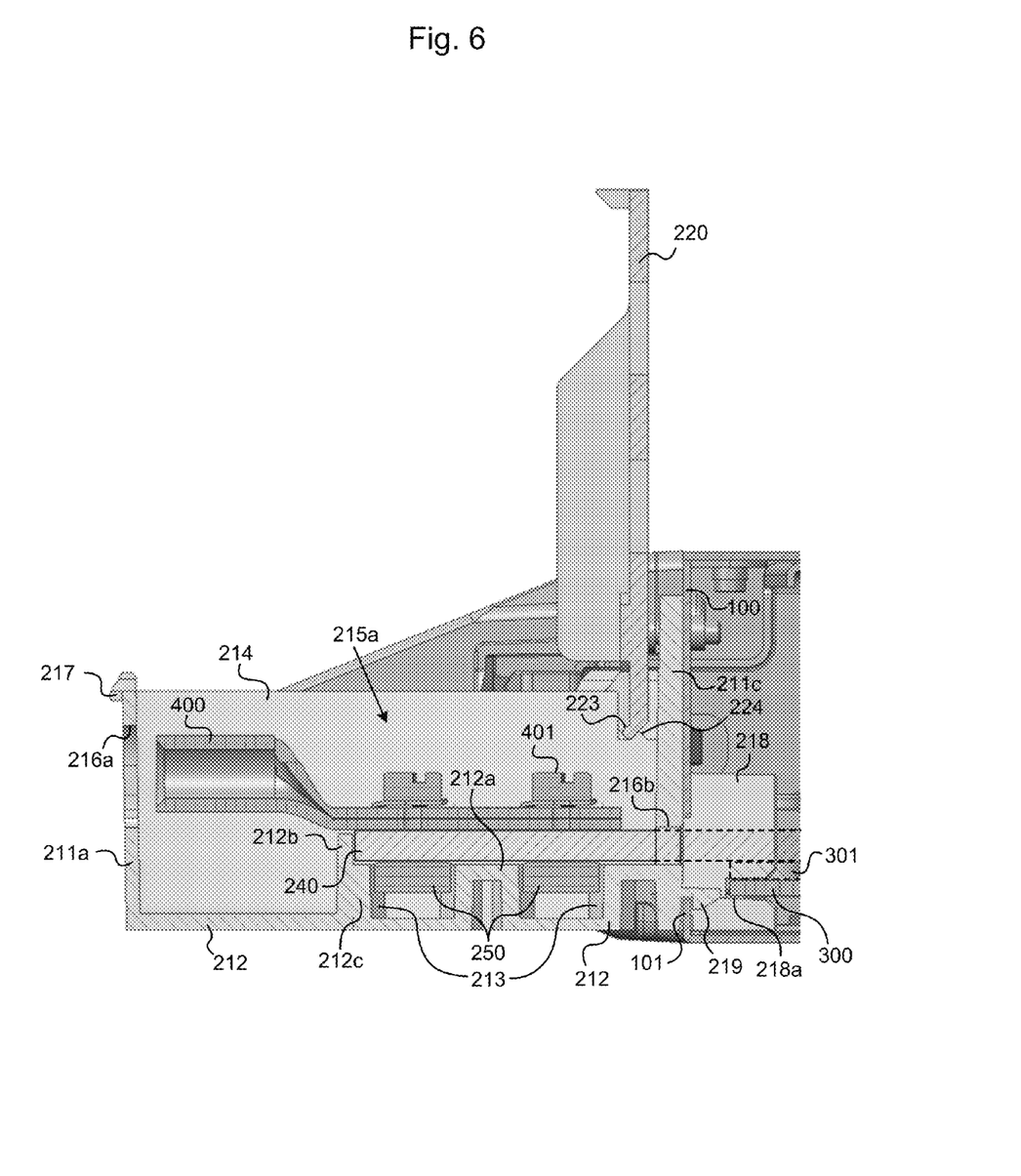
FIG. 6 is a cross-sectional view, taken along the line A in FIG. 3, of an example terminal block and a portion of an example power supply casing. In the drawing, portions of an example bus bar 240 and portions of an example intermediate member 301 are made transparent to reveal features located behind these portions. Outlines of the example bus bar 240 and the example intermediate member 301 in the portions thereof that are transparent in the drawing are shown as dashed lines.

The frame 210 may include exterior walls 211 (see FIGS. 2-8), a base 212 (see FIGS. 2-8), interior walls 214 (see FIGS. 3-6), a latch 217 (see FIGS. 3-6), a stabilizer 218 (see FIGS. 6-8), and a lock 219 (see FIG. 6). The frame 210 may be formed from an electrically insulating material, such as, for example, plastic. The frame 210 may be a single integrally connected entity; for example, the frame 210 may be formed as a single piece by injection molding, additive manufacturing (e.g., 3D printing), etc.

The exterior walls 211 may extend vertically away from the base 212, and together with the cover 220 may define an interior region of the terminal block 200. The exterior walls 211 may be referred to herein individually as the front wall 211a (see FIGS. 2-6), right wall 211b (see FIGS. 2-5, 7, and 8), rear wall 211c (see FIGS. 2 and 6-8), and left wall 211d (see FIGS. 3-5 and 8). The front wall 211a may have holes 216a (see FIGS. 2-6) through which electrical connectors that are connected with the lugs 400 may pass. The rear wall 211c may include holes 216b (see FIGS. 6 and 8) through which the bus bars 240 may extend out of the frame 210 and into the power supply casing 100.

The interior walls 214 may be located within the interior region of the terminal block 200, and may extend vertically from the base 212. The interior walls 214 may separate the interior region of the terminal block into compartments 215 (see FIGS. 3-6). For example, if there is one interior wall 214 as illustrated in FIGS. 1-8, the interior region may be divided thereby into two compartments 215a and 215b. Each of the compartments 215 may be to house one of the bus bars 240 and one of the lugs 400 once it has been connected to its corresponding bus bar 240 (see FIG. 3). In particular, each of the bus bars 214 extends from within the power supply casing 100 into a corresponding one of the compartments 215 (see FIGS. 4, 6, and 7). The interior walls 214 may serve to electrically isolate the bus bars 240 and/or the lugs 400 from one another.

The base 212 may serve as a bottom wall of the terminal block 200. The base 212 may include portions 212a, 212b, and 212c (see FIGS. 5 and 6) that may form platforms on which the bus bars 240 may rest and in which nut holders 213 are formed, with each compartment 215 having one of the platforms. The portions 212c may extend upward from a bottom part of the base 212 and may form side walls of the platform (see FIG. 6), the portions 212a may extend horizontally from the portions 212c and/or the exterior walls 211 and form a top plateau of the platform that is raised relative to a lowest part of the base 212 (see FIGS. 5 and 6), and the portions 212b may form a rim around the plateau (see FIGS. 5 and 6). The bus bars 240 may each rest on one of the portions 212a, and the rims formed by the portions 212b may help to keep the bus bars 240 in proper alignment over the nut holders 213. The nut holders 213 may be cavities that are recessed relative to the portions 212a and that have side walls formed by the portions 212c that are shaped so as to captively hold the nuts 250 (see FIGS. 5 and 6). Each compartment 215 may include at least one nut holder 213, and may include more than one nut holder 213. The number of nut holders 213 per compartment may correspond to a number of fasteners 401 per lug 400 and a number of fastener holes 241 per bus bar 240. In FIGS. 1-8, there are two nut holders 213 for each compartment 215.

Although FIGS. 1-8 illustrate the platforms and the nut holders 213 as being integrally formed from portions of the base 212, these features could also be provided as an element that is distinct from the base 212. For example, platforms that have nut holders 213 may be formed separately from the base 212, inserted into the compartments 215, and fixed to the frame 210 (for example, by adhesives, mechanical fasteners, thermal bonding, etc.).

The latch 217 may be to engage with a corresponding latch 221 of the cover 220 so as to retain the cover 220 in a closed position. The latch 221 of the cover may be pulled outward by a user to disengage it from the latch 217.

The stabilizer 218 may extend into the power supply casing 100 and contact the PCB 300 (see FIG. 6) to help stabilize the terminal block 200 and/or the PCB 300. For example, the stabilizer 218 may resist upward and/or downward motion of a distal end of the terminal block 200 and/or upward/downward motion of the PCB 300 as a result of the stabilizer 218 coming into contact with a side of the PCB 300. In certain examples, the stabilizer 218 may contact the PCB 300 on one side thereof, such as in FIG. 8 in which the stabilizer 218 would contact a top side of the PCB 300. In other examples, the stabilizer 218 it may contact the PCB 300 on two sides thereof, such as in FIG. 6 in which the stabilizer 218 contacts the top and bottom sides of the PCB 300.

The lock 219 may extend into the casing 100, and a hooked portion of the lock 219 may engage a wall 101 of the casing 100. The lock 219 may help to secure the terminal block 200 to the casing 100, together with the connectors 230.

Figure 2:
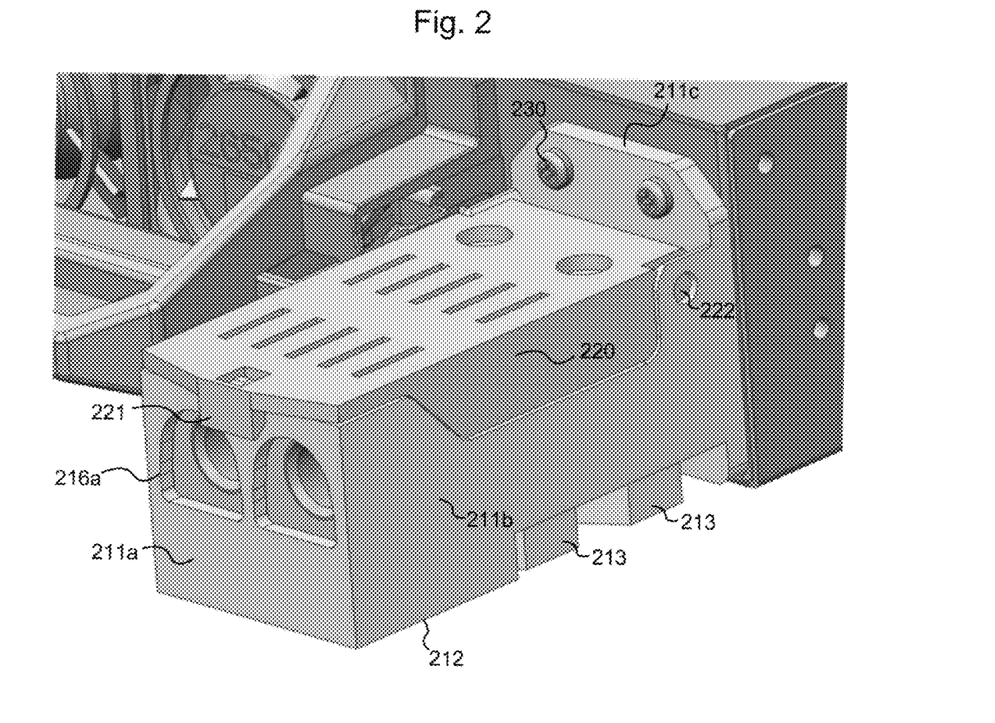
FIG. 2 is a perspective view of an example terminal block with its cover closed.
Figure 7:
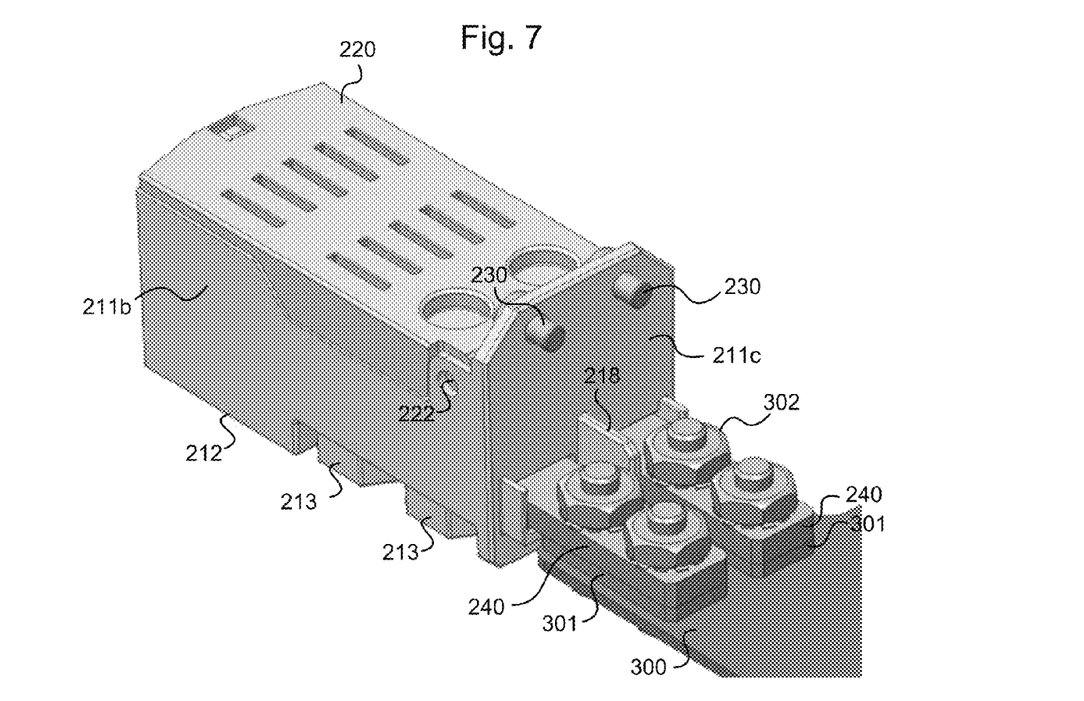
FIG. 7 is a perspective view of an example terminal block and a portion of an interior region of an example power supply casing. Portions of example bus bars that extend into the interior region of the example power supply casing are shown, as well as a portion of an example printed circuit board that is housed within the power supply casing. The power supply casing itself and other components that are housed therein have been omitted from the drawing for clarity.
Figure 8:
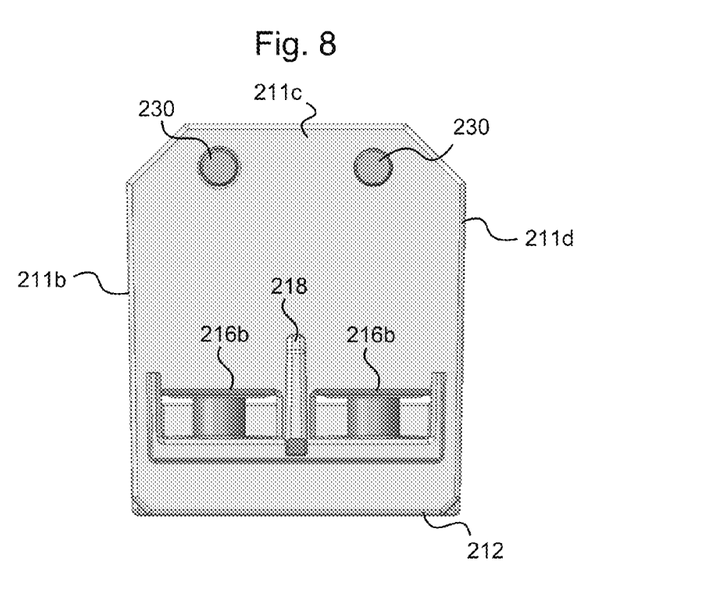
FIG. 8 is an elevation view of a rear of an example terminal block, in which the bus bars have been omitted.

The cover 220 corresponds to a top of the terminal block 200. The cover 220 may be movable between a closed position and an open position. In the closed position, the cover 220 and may disposed on a top side of the exterior walls 211 of the frame 210 such that the interior region of the terminal block 220 is covered. Thus, the frame 210 and the cover 220 together serve to enclose the interior region of the terminal block 200. In the open position, the cover 220 may cover part or none of the interior region of the terminal block 220, such that the interior region is accessible to a user. For example, the cover 220 may be rotably connected to the frame 210 via pivots 222 (see FIG. 2), and may be rotated between the closed position in which it is approximately parallel to the base 212 and covers the interior region (as illustrated in FIGS. 1, 2, and 7) and the open position in which it is approximately perpendicular to the base 212 and does not cover the interior region (as illustrated in FIGS. 3-6). As another example, the cover 220 may be slidably connected to the frame 210 (not illustrated) such that the cover 220 may be slid horizontally relative to the frame 210 between an open position in which the interior region is fully covered and a closed position in which at least part of the interior region is not covered. As another example, the cover 220 may be removably connected to the frame 210 such that in the closed position the cover 220 is engaged with the frame 210 so as to hold the cover 220 in place (for example, via friction latching members, not illustrated) and in the open position the cover 220 is removed from the frame 210.

In examples in which the cover 220 is rotably connected to the frame 210, the terminal block may include a detent that serves to hold the cover in the open position. The detent may be formed, for example, by a detent member 223 that is part of the cover 220 and a detent member 224 that is part of the frame 210. The detent member 223 may be, for example, a rounded protrusion that extends from the cover 220, and the detent member 224 may be a rounded protrusion that extends from the interior wall 214. The detent may be such that the cover 220 cannot be moved out of the open position due merely to its own weight (i.e., the cover 220 cannot fall shut), but the cover 220 can be moved out of the open position when some additional force is applied to the cover 220. The detent member 223 and the detent member 224 may engage one another when the cover 220 is in an open position such that the cover 220 is held open. For example, rotation of the cover 220 is resisted by the detent member 223 coming into contact with the detent member 224. When sufficient force is applied to the cover 220, the detent member 224 may cause the detent member 223 to flex to the point that the detent member 223 is able to slide past the detent member 224 and hence the cover 220 is released to be closed.

The connectors 230 may connect the frame 210 to the power supply casing 100. For example, the connectors 230 may be mechanical connectors such as screws, bolts, rivets, etc. In certain examples, the connectors 230 are removable connectors, such as, for example, screws. The connectors 230 may also include integrated snap features or other locking mechanisms (not illustrated).

The bus bars 240 may be electrically conductive bars that are to electrically connect the PCB 300 to the lugs 400. In particular, a portion of each bus bar 240 extends into one of the compartments 215 (see FIGS. 4 and 6), and another portion of each bus bar 240 extends into the interior of the power supply 10 (see FIGS. 6 and 7).

Figure 3:
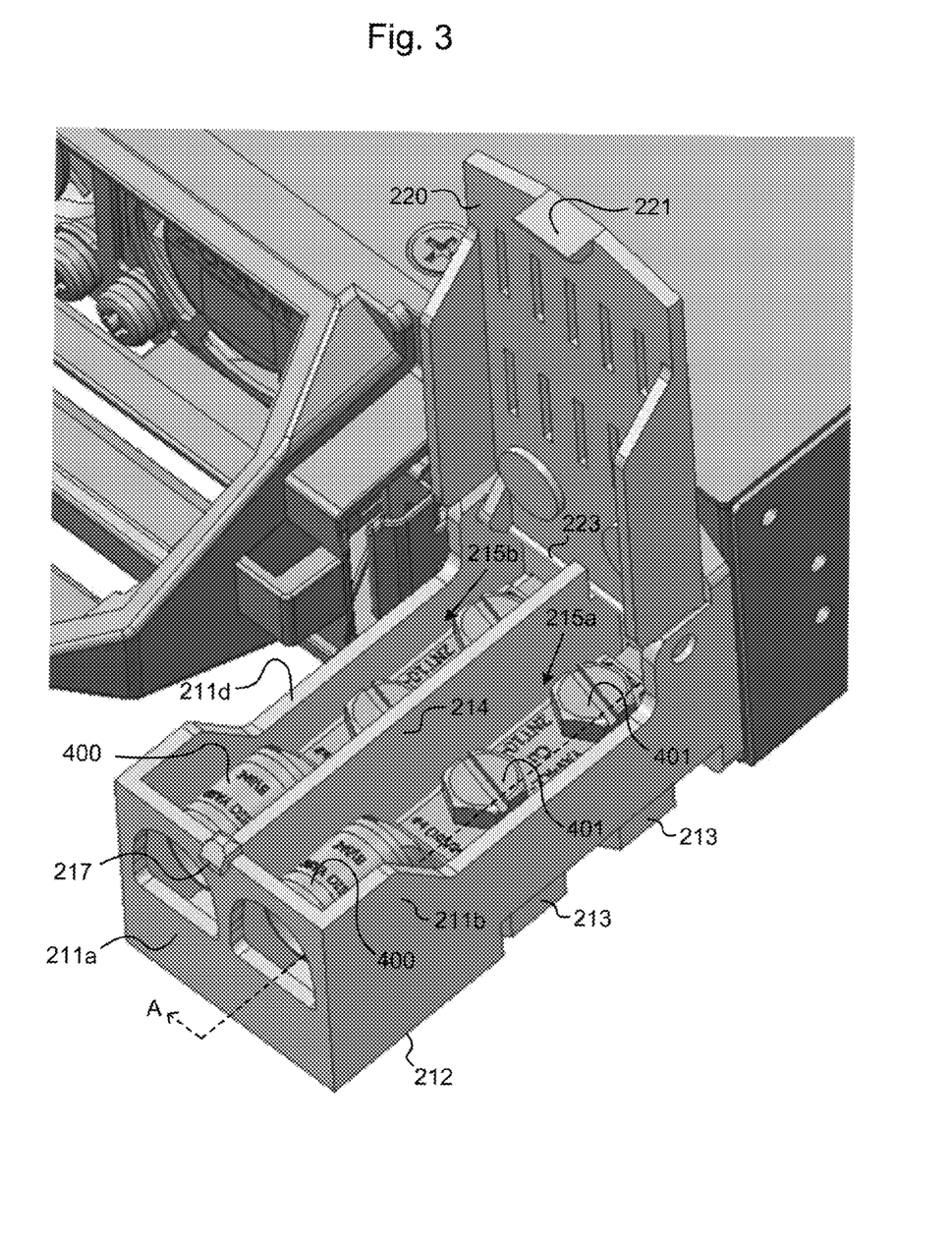
FIG. 3 is a perspective view of an example terminal block with its cover open, showing interior compartments of the example terminal block with lugs installed.
Figure 4:
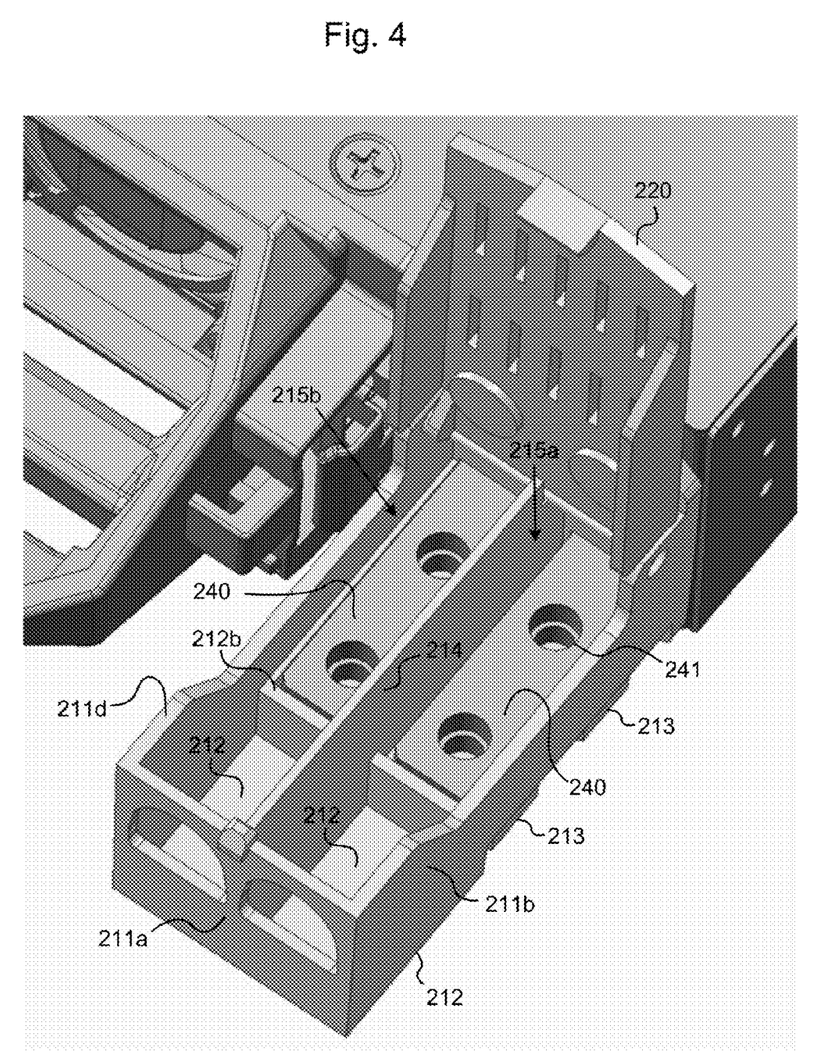
FIG. 4 is a perspective view of an example terminal block with its cover open, showing interior compartments of the example terminal block with lugs and fasteners removed.
Figure 5:
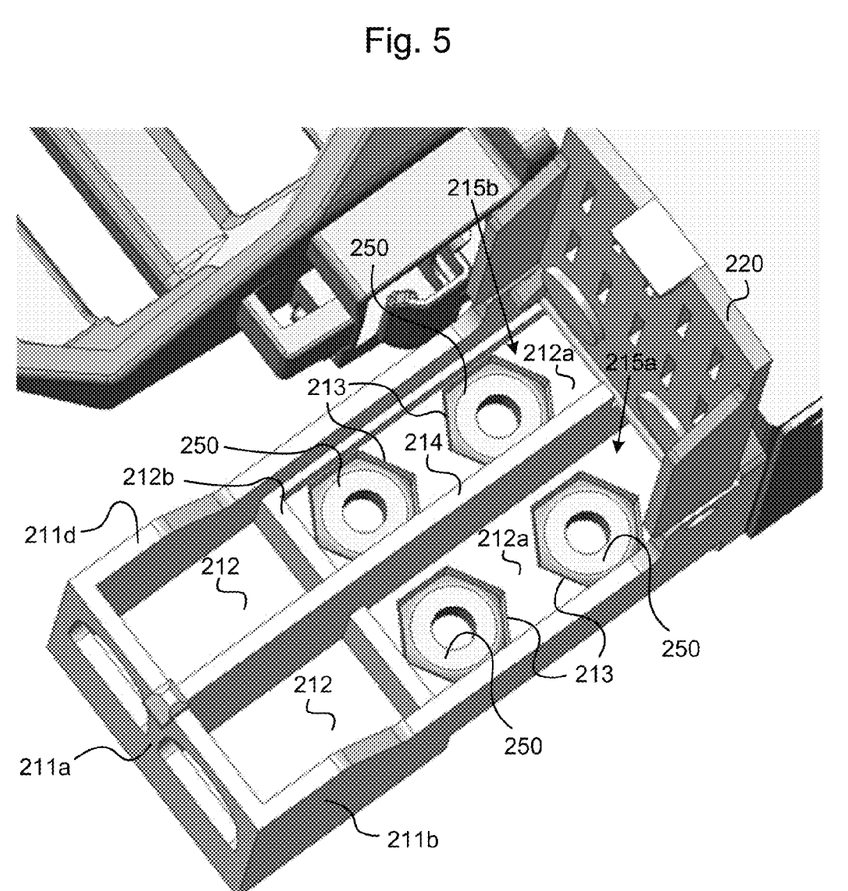
FIG. 5 is a perspective view of an example terminal block with its cover open, showing interior compartments of the example terminal block with lugs, bus bars, and fasteners removed.

The portion of the bus bar 240 that is within the compartment 215 is disposed on one of the platforms formed by the base 212 (describe above) (see FIGS. 4-6), and is to be connected to a corresponding lug 400 via fasteners 401 and nuts 250 (see FIGS. 3 and 6). For example, the bus bars 240 may each include fastener holes 241 (see FIG. 4), and the lugs 400 may include fastener holes (not illustrated) that correspond to the fastener holes 241. Each lug 400 may be connected its corresponding bus bar 240 by inserting fasteners 401 through the fastener holes of the lugs 400, through the fastener holes 241 of the bus bar 240, and into the nuts 250, and then tightening the fasteners 401. The fastener holes 241 may be located so as to be aligned (approximately) over a center of a corresponding nut holder 213 when the respective bus bar 240 is installed in the terminal block 240 (see FIG. 4). For example, a rim formed by the portion 212b may be included in the terminal block 200 so as to aid a user in positioning the bus bar 240 such that its fastener holes 241 are aligned over the nut holders 213; in particular, by positioning the bus bar 240 such that it is flush with the rim, a user may be assured that the fastener holes 241 are appropriately aligned. This may make it easier for a user to insert the fasteners through the fastener hole 241 and into the nut 250 below, since the user does not have to manually align the nut 250 with the fastener hole 241. In this context, the centers being "approximately" aligned means the centers are located within 3 mm of each other in a plan view.

The portion of the bus bar 240 that is within an interior region of the power supply casing 100 may be physically connected to the PCB 300 and electrically connected to a power input terminal of the PCB 300. For example, the bus bar 240 may be physically connected to the PCB 300 via fasteners 302 (see FIG. 7), which may be mechanical fasteners such as screws, bolts, and the like. As another example, the bus bar 240 may be physically connected to the PCB 300 via solder, welding, or the like (not illustrated). As another example, the bus bar 240 may be physically connected to the PCB 300 via engagement with a bus bar receiving member (not illustrated) that uses friction to hold the bus bar 240 once it is inserted in the member. In this context, "physically connected" does not require that the bus bars 240 be in direct contact with the PCB 300; for example, intermediate members, such as intermediate members 301 (see FIGS. 6 and 7), may be disposed between the bus bars 240 and the PCB 300. The intermediate members 301 may be, for example, electrical contact pads, shims, spacers, washers, etc. The bus bar 240 may be electrically connected to the input power terminal of the PCB 300 when there is a conductive path between the bus bar 240 and the input power terminal of the PCB 300. This conductive path may be established, for example, by the bus bars 240 being in direct contact with the input terminal of the PCB 300, or may be established by the bus bars 240 being in contact with one or more intermediate members that are electrically conductive, such as the intermediate members 301, and that are electrically connected to the input terminal of the PCB 300.

Various features of the example terminal blocks and power supplies may have been described herein in singular form for simplicity of explanation and/or grammatical convenience, but this should not be interpreted to imply that multiple instances of such features cannot be included in the terminal block/power supply, unless explicitly stated otherwise. In other words, the usage of the singular form in describing a feature should not be interpreted as imparting any limitation related to the number of such features, unless explicitly stated otherwise.

Moreover, certain features may be referred to in pluralized form for simplicity of explanation and/or grammatical convenience, but this should not be interpreted to imply that there cannot be a single instance of the feature, unless explicitly stated otherwise. In other words, the usage of the pluralized form in describing a feature should not be interpreted as imparting any limitation related to the number of such features, unless explicitly stated otherwise.

The foregoing describes example terminal blocks and example power supplies that include terminal blocks. While the above disclosure has been shown and described with reference to the foregoing examples, it should be understood that other forms, details, and implementations may be made without departing from the spirit and scope of this disclosure.

What is claimed is:

1. A power supply, comprising:
a power supply casing; and a terminal block comprising:
  a frame attached to the power supply casing and formed from an electrical insulator, comprising:
    a base,
    exterior walls connected to the base, and
    a number of interior walls that separate an interior region of the frame into multiple compartments;
  a nut holder in each of the compartments, each of the nut holders having a cavity formed therein that is shaped so as to hold a nut captive,
  a nut held captive in each of the nut holders;
  a bus bar for each of the compartments, each of the bus bars extending from within the power supply casing into its corresponding compartment such that a fastener hole in the respective bus bar is aligned over one of the nut holders; and
  a cover that is formed from an electrical insulator and is connected to the frame such that the cover may transition between an open position and a closed position,
  wherein the frame includes a stabilizer portion that extends into the power supply casing and contacts a printed circuit board of the power supply.

2. The power supply of claim 1,
wherein the compartments are such that, when lugs are connected to the bus bars, each of the bus bars is electrically isolated from each of the other bus bars and each of the lugs is electrically isolated from each of the other lugs.

3. The power supply of claim 1,
wherein the stabilizer portion includes a first member that contacts the printed circuit board on a first side thereof and a second member that contacts the printed circuit board on a second side thereof, the first side being opposite the second side.

4. The power supply of claim 1, further comprising:
a lug for each of the bus bars, each of the lugs being connected to its corresponding bus bar via at least one mechanical fastener that extends through a fastener hole of the respective lug, extends through the fastener hole of the corresponding bus bar, and couples with one of the nuts.

5. The power supply of claim 1,
wherein the frame and the cover each include latching members that engage one another to retain the cover in the closed position.

6. The power supply of claim 1,
wherein the frame and the cover each include detent members that engage one another to retain the cover in the open position.

7. A power supply, comprising:
a printed circuit board;
a power supply casing that houses the printed circuit board; and
a terminal block comprising:
  a frame that is attached to the power supply casing, is formed from an electrical insulator, and comprises:
    a base,
    exterior walls connected to the base, and
    a number of interior walls that separate an interior region of the frame into multiple compartments;
  a bus bar for each of the compartments, each of the bus bars being electrically connected to the printed circuit board and extending from within the power supply casing into its corresponding compartment; and
  a cover that is formed from an electrical insulator and is connected to the frame such that the cover may transition between an open position and a closed position,
  wherein the frame includes a stabilizer portion that extends into the power supply casing and contacts the printed circuit board.

8. The power supply of claim 7,
wherein the base includes a nut holder in each of the compartments, each of the nut holders having a cavity formed therein that is shaped so as to hold a nut captive,
the terminal block includes a nut held captive in each of the nut holders, and
each of the bus bars has a fastener hole that is aligned over one of the nut holders.

9. The power supply of claim 8, further comprising:
a lug for each of the bus bars, each of the lugs being connected to its corresponding bus bar via at least one mechanical fastener that extends through a fastener hole of the respective lug, extends through the fastener hole of the corresponding bus bar, and couples with one of the nuts.

10. The power supply of claim 7,
wherein the compartments are such that, when lugs are connected to the bus bars, each of the bus bars is electrically isolated from each of the other bus bars and each of the lugs is electrically isolated from each of the other lugs.

11. The power supply of claim 7,
wherein the stabilizer portion includes a first member that contacts the printed circuit board on a first side thereof and a second member that contacts the printed circuit board on a second side thereof, the first side being opposite the second side.

12. The power supply of claim 7,
wherein the frame and the cover each include latching members that engage one another to retain the cover in the closed position.

13. The power supply of claim 7,
wherein the frame and the cover each include detent members that engage one another to retain the cover in the open position.

14. A terminal block for a power supply, comprising:
a frame that is to attach to a power supply casing, is formed from an electrical insulator, and comprises:
  a base,
  exterior walls connected to the base, and
  a number of interior walls that separate an interior region of the frame into multiple compartments; and
a cover that is formed from an electrical insulator and is connected to the frame such that the cover may transition between an open position and a closed position,
wherein each of the compartments electrically isolates bus bars that extend from within the power supply casing into the frame from one another, when the frame is attached to the power supply casing, and
wherein the base includes a nut holder in each of the compartments, each of the nut holders having a cavity formed therein that is shaped so as to hold a nut captive,
wherein the frame includes a stabilizer portion that, when the frame is attached to the power supply casing, extends into the power supply casing and contacts a printed circuit board of the power supply.

15. The terminal block of claim 14,
wherein the compartments are such that, when the frame is attached to the power supply casing and lugs are connected to the bus bars, each of the lugs is electrically isolated from each of the other lugs.

16. The terminal block of claim 14,
wherein the stabilizer portion includes a first member that is to contact the printed circuit board on a first side thereof and a second member that is to contact the printed circuit board on a second side thereof, the first side being opposite the second side.

17. The terminal block of claim 14, further comprising:
a latch that is to fix a position of the terminal block relative to the power supply casing.

18. The terminal block of claim 14,
wherein the frame and the cover each include latching members that engage one another to retain the cover in the closed position.

\* \* \* \* \*